United States Patent

Hioka et al.

(10) Patent No.: US 10,060,991 B2
(45) Date of Patent: Aug. 28, 2018

(54) SEMICONDUCTOR DEVICE

(71) Applicant: SII Semiconductor Corporation, Chiba-shi, Chiba (JP)

(72) Inventors: Takaaki Hioka, Chiba (JP); Mika Ebihara, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/814,986

(22) Filed: Nov. 16, 2017

(65) Prior Publication Data

US 2018/0203078 A1    Jul. 19, 2018

(30) Foreign Application Priority Data

Jan. 18, 2017 (JP) .................................. 2017-006527

(51) Int. Cl.
*G01R 33/07*    (2006.01)
*H01L 43/04*    (2006.01)
*H01L 43/06*    (2006.01)

(52) U.S. Cl.
CPC ............ *G01R 33/077* (2013.01); *H01L 43/04* (2013.01); *H01L 43/065* (2013.01)

(58) Field of Classification Search
CPC ...... G01R 33/077; H01L 43/04; H01L 43/065
See application file for complete search history.

(56) References Cited

U.S. PATENT DOCUMENTS

| | | | | |
|---|---|---|---|---|
| 4,929,993 A | * | 5/1990 | Popovic | H01L 27/22 257/424 |
| 9,312,473 B2 | | 4/2016 | Kosier et al. | |
| 2009/0295375 A1 | * | 12/2009 | Oohira | G01D 5/145 324/207.21 |

* cited by examiner

*Primary Examiner* — Karen Kusumakar
(74) *Attorney, Agent, or Firm* — Brinks Gilson & Lione

(57) ABSTRACT

Provided is a semiconductor device including a vertical Hall element with improved sensitivity. The vertical Hall element includes: a semiconductor layer of a second conductivity type formed on the semiconductor substrate; a plurality of electrodes aligned along a straight line on a surface of the semiconductor layer and being impurity regions of the second conductivity type being higher in concentration than the semiconductor layer; a plurality of electrode isolation diffusion layers of the first conductivity type respectively arranged between adjacent electrodes of the plurality of electrodes on the surface of the semiconductor layer to isolate the plurality of electrodes from one another; and embedded layers being an impurity region of the second conductivity type which is higher in concentration than the semiconductor layer and being respectively provided substantially right below one of the plurality of electrode isolation diffusion layers between the semiconductor substrate and the semiconductor layer.

11 Claims, 2 Drawing Sheets

SEMICONDUCTOR DEVICE

RELATED APPLICATIONS

This application claims priority under 35 U.S.C. § 119 to Japanese Patent Application No. 2017-006527 filed on Jan. 18, 2017, the entire content of which is hereby incorporated by reference.

BACKGROUND OF THE INVENTION

1. Field of the Invention

The present invention relates to a semiconductor device, and more particularly, to a semiconductor device that includes a vertical Hall element configured to detect a magnetic field in a horizontal direction.

2. Description of the Related Art

A Hall element is capable of detecting position or angle without contact as a magnetic sensor, and accordingly has various uses. While magnetic sensors that use a horizontal Hall element configured to detect magnetic field components perpendicular to a semiconductor substrate surface are particularly well known, there have been proposed various magnetic sensors that use a vertical Hall element configured to detect magnetic field components parallel to a substrate surface. Proposed magnetic sensors also include a magnetic sensor that combines a horizontal Hall element and a vertical Hall element to detect a magnetic field two-dimensionally or three-dimensionally.

Enhancement of sensitivity, however, is more difficult in a vertical Hall element than in a horizontal Hall element.

In view of the above, in U.S. Pat. No. 9,312,473 (see FIG. 3, in particular), there is proposed a configuration in which a plurality of electrodes each of which is an N-type diffusion layer and a plurality of electrode isolation diffusion layers (P-type fingers) each of which is a P-type diffusion layer to isolate adjacent electrodes from each other are formed on a surface of a magnetism sensing portion (N-type semiconductor wafer), and an N-type embedded layer (N-type blanket) higher in concentration than the magnetism sensing portion is formed right below each of the electrodes. With this configuration, improvement in sensitivity is proposed by increasing a current component that flows between each the electrodes on the surface of the magnetism sensing portion and the corresponding low-resistance embedded layer situated right below the each electrode, namely, current components that flow in a direction perpendicular to the semiconductor wafer.

The structure of U.S. Pat. No. 9,312,473, however, has a problem given below.

A current supplied between two electrodes of the drive current supply electrodes that sandwich an electrode of the Hall voltage output electrodes flows from one of the drive current supply electrodes on the surface of the magnetism sensing portion to a direction toward the low-resistance N-type embedded layer right below this electrode (flows downward). The current then flows to the N-type embedded layer right below the Hall voltage output electrode, flows from there to the N-type embedded layer right below the other drive current supply electrode, and flows further to the other drive current supply electrode on the surface of the magnetism sensing portion (flows upward). Because N-type embedded layers respectively present right below drive current supply electrodes, each of current paths that are in a direction perpendicular to the surface of the semiconductor wafer is distant from the Hall voltage output electrode. The long distance of the Hall voltage output electrode from the current paths means a small Hall voltage, namely, low sensitivity.

In addition, since the high impurity concentration N-type embedded layer is also formed right below the Hall voltage output electrode, a current component that flows in a direction parallel to the semiconductor wafer below the Hall voltage output electrode flows in the N-type embedded layer which is a region having the lowest resistance (the highest concentration). In other words, the current component that flows in the direction parallel to the semiconductor wafer flows in a region that is low in mobility. The magnetic sensitivity of a Hall element is known to rise in proportion to mobility, and a sensitivity provided by the current component that flows in the direction parallel to the semiconductor wafer is accordingly low.

In the structure of U.S. Pat. No. 9,312,473, as a result, sensitivity is only slightly improved.

SUMMARY OF THE INVENTION

It is an object of the present invention to provide a semiconductor device having a vertical Hall element with improved sensitivity.

In one embodiment of the present invention, there is provided a semiconductor device including: a semiconductor substrate of a first conductivity type; and a vertical Hall element provided on the semiconductor substrate, wherein the vertical Hall element has: a semiconductor layer of a second conductivity type formed on the semiconductor substrate; a plurality of electrodes aligned along a straight line on a surface of the semiconductor layer and being impurity regions of the second conductivity type being higher in concentration than the semiconductor layer; a plurality of electrode isolation diffusion layers of the first conductivity type respectively arranged between adjacent electrodes of the plurality of electrodes on the surface of the semiconductor layer to isolate the plurality of electrodes from one another, and embedded layers being an impurity region of the second conductivity type which is higher in concentration than the semiconductor layer and being respectively provided substantially right below one of the plurality of electrode isolation diffusion layers between the semiconductor substrate and the semiconductor layer.

In the present invention, since the embedded layers are high in concentration and low in resistance, the current flows as follows when a current is supplied between two electrodes that function as drive current supply electrodes. That is, the current first flows from one of the two drive current supply electrodes on the surface of the semiconductor layer to the embedded layer that is substantially right below the electrode isolation diffusion layer adjacent to the one of the two drive current supply electrodes. Then the current flows in parallel to the semiconductor substrate toward another embedded layer that is substantially right below the electrode isolation diffusion layer adjacent to the other of the two drive current supply electrodes. After that the current flows from this embedded layer to the other of the two drive current supply electrodes on the surface of the semiconductor layer.

A current path from one of the two drive current supply electrodes to the embedded layer and a current path from another embedded layer to the other of the two drive current supply electrodes are therefore current components perpendicular to the semiconductor substrate (the current paths are actually slanted a little but can be deemed as substantially perpendicular), and the distances of the current components perpendicular to the semiconductor substrate from the Hall voltage output electrode are both shorter than in U.S. Pat. No. 9,312,473. A Hall voltage obtained from the current components perpendicular to the semiconductor substrate is accordingly large.

In addition, a current component parallel to the semiconductor substrate is formed between adjacent embedded layers as described above. In other words, the current component parallel to the semiconductor substrate flows inside the semiconductor layer which has a low impurity concentration, below the Hall voltage output electrode. A large Hall voltage is accordingly obtained from the current that flows in parallel to the semiconductor substrate in the semiconductor layer which has high mobility.

A Hall voltage provided by a current that flows in a direction perpendicular to the semiconductor substrate and a Hall voltage provided by a current that flows in a direction parallel to the semiconductor substrate can be both obtained efficiently in this manner.

The vertical Hall element can consequently have high magnetic sensitivity.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will be now described herein with reference to illustrative embodiments.

Figure 1A:
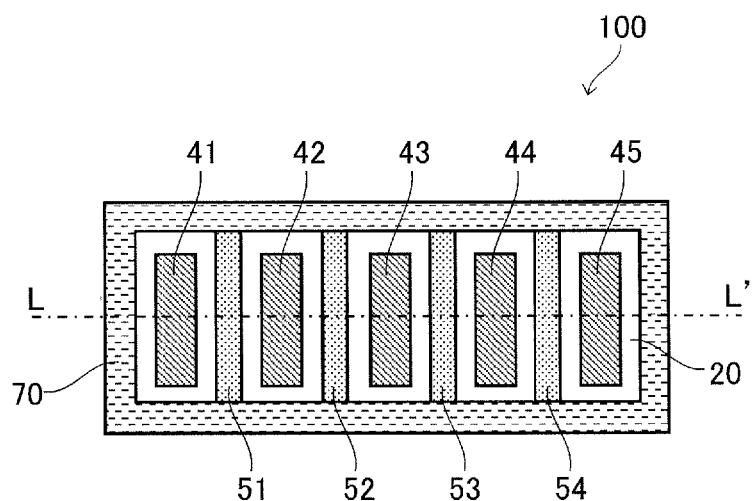
FIG. 1A is a plan view of a semiconductor device that includes a vertical Hall element according to an embodiment of the present invention.
Figure 1B:
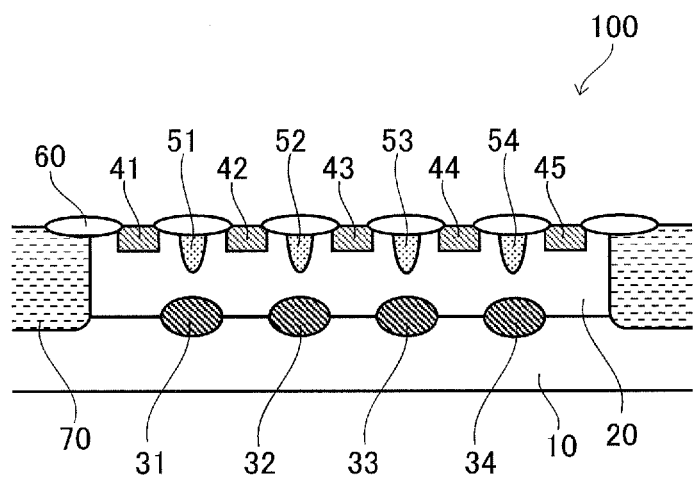
FIG. 1B is a sectional view taken along the line L-L' of FIG. 1A.

FIG. 1A and FIG. 1B are views for illustrating a semiconductor device that includes a vertical Hall element according to an embodiment of the present invention. FIG. 1A is a plan view of the semiconductor device, and FIG. 1B is a sectional view taken along the line L-L' of FIG. 1A.

The semiconductor device of this embodiment includes, as illustrated in FIG. 1A and FIG. 1B, a P-type (first conductivity type) semiconductor substrate 10, a vertical Hall element 100 provided on the semiconductor substrate 10, and a P-type element isolation diffusion layer 70 formed so as to surround the perimeter of the vertical Hall element 100.

The vertical Hall element 100 includes an N-type (second conductivity type) semiconductor layer 20, electrodes 41 to 45, P-type electrode isolation diffusion layers 51 to 54, and N-type embedded layers 31 to 34. The N-type semiconductor layer 20 is formed on the semiconductor substrate 10. The electrodes 41 to 45 are N-type impurity regions that are aligned along a straight line on a surface of the N-type semiconductor layer 20 and are higher in concentration than the N-type semiconductor layer 20, and serve as drive current supply electrodes and Hall voltage output electrodes. The P-type electrode isolation diffusion layers 51 to 54 are each formed between two of the electrodes 41 to 45 to isolate the electrodes 41 to 45 from one another, in the surface of the N-type semiconductor layer 20. The N-type embedded layers 31 to 34 are formed below the electrode isolation diffusion layers 51 to 54, respectively, between the semiconductor substrate 10 and the semiconductor layer 20, and are higher in concentration than the N-type semiconductor layer 20.

In the vertical Hall element 100, an insulating film, for example, a $SiO_2$ film 60 covers a surface of the N-type semiconductor layer 20 and the electrode isolation diffusion layers 51 to 54, except for regions in which the electrodes 41 to 45. This enables the semiconductor device to control a current flowing parallel to the semiconductor substrate 10 in the surface of the N-type semiconductor layer 20.

The N-type embedded layers 31 to 34 are placed substantially right below the electrode isolation diffusion layers 51 to 54, respectively.

The N-type embedded layers 31 to 34 are formed between the semiconductor substrate 10 and the N-type semiconductor layer 20 by, for example, selectively implanting N-type impurities in the semiconductor substrate 10, forming an epitaxial layer that is used as the N-type semiconductor layer 20, and diffusing the implanted N-type impurities.

The N-type embedded layers 31 to 34 are preferred to have a smaller thickness and a higher concentration in order to enhance magnetic sensitivity. It is also desirable to avoid forming the N-type embedded layers 31 to 34 right below electrodes in order to bring current components perpendicular to the semiconductor substrate 10 as close to Hall voltage output electrodes as possible when a current is supplied to drive current supply electrodes.

In order to achieve higher magnetic sensitivity, the N-type semiconductor layer 20 is preferred to be thicker, for example, 6 μm or more.

The element isolation diffusion layer 70 is formed so as to reach the P-type semiconductor substrate 10 and have a depth which pasts the bottom of the N-type semiconductor layer 20, electrically isolating the vertical Hall element 100 from other regions (not shown) on the semiconductor substrate 10.

Elements provided in the other regions (not shown) on the semiconductor substrate 10 that are electrically isolated from the vertical Hall element 100 by the P-type element isolation diffusion layer 70 include a transistor that is a constituent of a circuit configured to process a signal output from the vertical Hall element 100, or a circuit configured to supply a signal to the vertical Hall element 100.

The P-type electrode isolation diffusion layers 51 to 54 are formed by, for example, selectively diffusing P-type impurities in the N-type semiconductor layer 20.

The electrodes 41 to 45 are formed by, for example, covering the tops of the formed P-type electrode isolation diffusion layers 51 to 54 with the $SiO_2$ film 60 that is formed by LOCOS, while leaving regions in which the electrodes 41 to 45 are formed, and then introducing N-type impurities with the $SiO_2$ film 60 used as a mask. The electrodes 41 to 45 are formed so as to have a depth equal to or less than the depth of the P-type electrode isolation diffusion layers 51 to 54.

Figure 2:
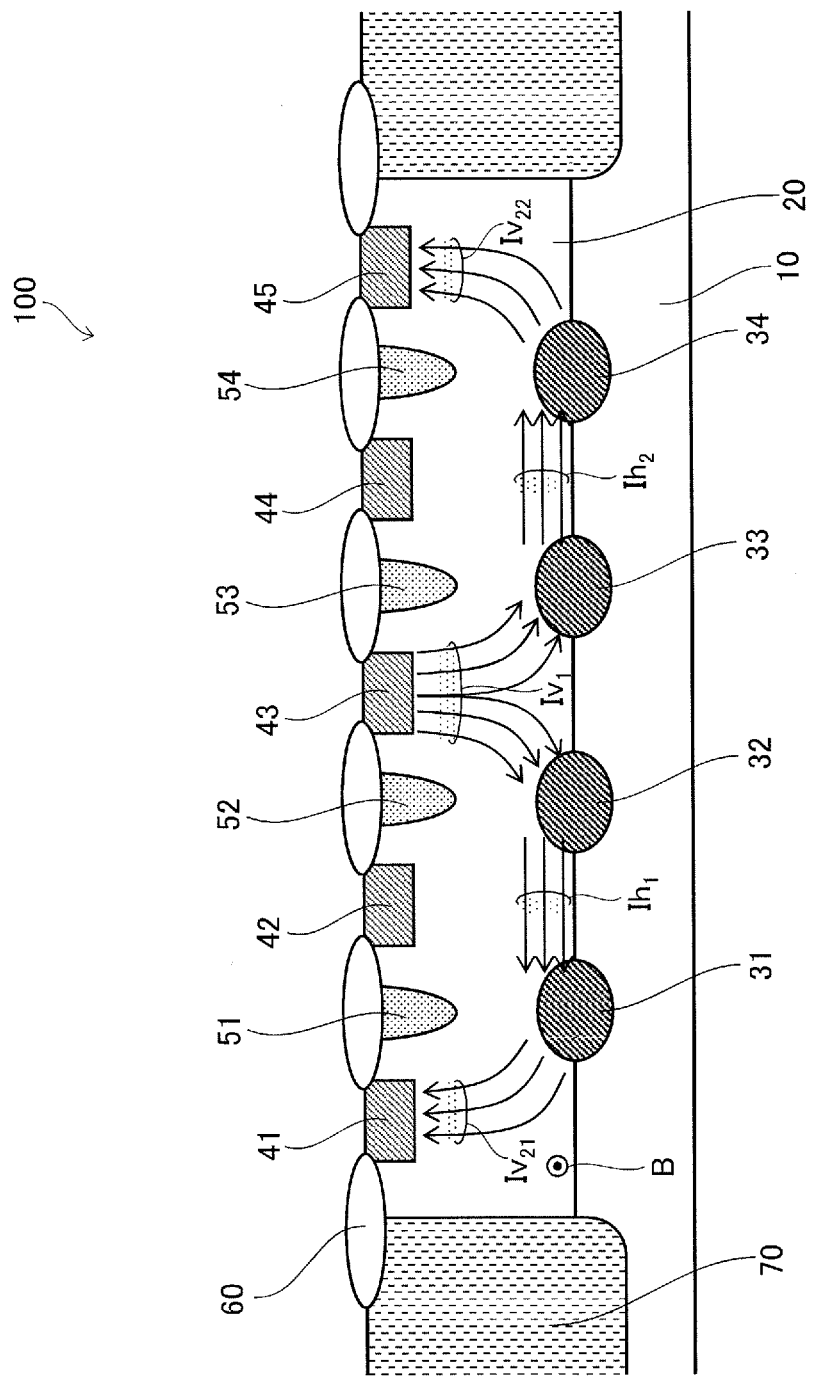
FIG. 2 is an enlarged view of FIG. 1B.

A description given next with reference to FIG. 2 is about the principle of detecting a magnetic component that is in a direction parallel to the semiconductor substrate 10 in the vertical Hall element 100 of the semiconductor device according to this embodiment.

FIG. 2 is an enlarged view of the sectional view of FIG. 1B, and is a schematic illustration of a current flow when a drive current is supplied to the electrodes 41, 43, and 45 so that a current flows from the electrode 43 to the electrodes 41 and 45.

As indicated by "B" in FIG. 2, a magnetic field is applied from the far side to the near side on the drawing sheet, in the direction parallel to the semiconductor substrate 10.

When a current is caused to flow from the electrode 43 to the electrodes 41 and 45 in the vertical Hall element 100 configured as described above, the current first flows from the electrode 43 toward the high concentration N-type embedded layers 32 and 33 in the N-type semiconductor layer 20 as indicated by arrows $Iv_1$. The current at this point flows toward the direction of the rear surface of the semiconductor substrate 10 (downward) substantially perpendicularly to the semiconductor substrate 10 (the flow is actually slanted a little but can be deemed as a substantially perpendicular), while approaching the Hall voltage output electrodes 42 and 44.

The current then passes through the N-type embedded layers 32 and 33 and flows in the N-type semiconductor layer 20 toward the N-type embedded layers 31 and 34 in directions parallel to the semiconductor substrate 10 (leftward direction and rightward direction) as indicated by arrows $Ih_1$ and $Ih_2$. The current components flowing in the directions parallel to the semiconductor substrate 10 flows through a lower part in the N-type semiconductor layer 20 as indicated by the arrows $Ih_1$ and $Ih_2$ due to the presence of the P-type electrode isolation diffusion layers 52 and 53 on the left and right of the electrode 43, and the low-resistance N-type embedded layers 31 and 34 being in the bottom part of the N-type semiconductor layer 20.

The current then passes through the N-type embedded layers 31 and 34 and flows in a direction substantially perpendicular to the semiconductor substrate 10 as indicated by arrows $Iv_{21}$ and $Iv_{22}$ toward the direction of the front surface of the semiconductor layer 20 (upward) in the N-type semiconductor layer 20, to flow into the electrodes 41 and 45.

The magnetic field acts on the current components $Iv_1$, $Iv_{21}$, and $Iv_{22}$ perpendicular to the semiconductor substrate 10, and the current components $Ih_1$ and $Ih_2$ parallel to the semiconductor substrate 1. Thereby, for each of the current components, electromotive forces are generated in a direction perpendicular to both the current component and the magnetic field. Specifically, a Lorentz force is each generated in a direction from the electrode 43 toward the electrode 42 (leftward direction) for the current component $Iv_1$, a direction from the electrode 41 toward the electrode 42 (rightward direction) for the current component $Iv_{21}$, a direction from the electrode 45 toward the P-type electrode isolation diffusion layer 54 (rightward direction) for the current component $Iv_{22}$, a direction from the semiconductor substrate 10 toward the electrode 42 (upward direction) for the current component $Ih_1$, and a direction from the N-type semiconductor layer 20 toward the semiconductor substrate 10 (downward direction) for the current component $Ih_2$.

In this embodiment, a potential difference is generated between the electrode 42 and the electrode 44 by both the Lorentz force that is generated with respect to the current components $Iv_1$, $Iv_{21}$, and $Iv_{22}$, which flow in directions perpendicular to the semiconductor substrate 10, and the magnetic field in the direction perpendicular to the current components $Iv_1$, $Iv_{21}$, and $Iv_{22}$ and the Lorentz force that is generated with respect to the current components $Ih_1$ and $Ih_2$, which flow in directions parallel to the semiconductor substrate 10, and the magnetic field in the direction perpendicular to the current components $Ih_1$ and $Ih_2$. This embodiment uses the potential difference to detect the magnetic field.

The current components $Ih_1$ and $Ih_2$, which flow in the directions parallel to the semiconductor substrate 10, and the current components $Iv_1$, $Iv_{21}$, and $Iv_{22}$, which flow in the directions perpendicular to the semiconductor substrate 10, flow inside the N-type semiconductor layer 20 which has a low impurity concentration in this embodiment as described above. According to this embodiment, the Hall element's magnetic sensitivity, which rises in proportion to mobility, can therefore be enhanced even more.

In this embodiment, while approaching the Hall voltage output electrodes 42 and 44 as described above, the current components $Iv_1$, $Iv_{21}$, and $Iv_{22}$ flow in perpendicular directions. Bringing the current path of a current close to a Hall voltage output terminal without allowing the current to flow directly into the Hall voltage output terminal is known to be effective in efficiently obtaining a voltage that is generated by a Lorentz force. According to this embodiment, the magnetic sensitivity can therefore be enhanced even more.

According to this embodiment, a semiconductor device that includes a high sensitivity vertical Hall element is realized in this manner.

It is apparent that the present invention is not limited to the above embodiments, but may be modified and changed without departing from the scope and spirit of the invention.

For example, the first conductivity type and the second conductivity type, which are the P type and the N type, respectively, in the embodiment described above, may be switched to set the first conductivity as the N type and the second conductivity as the P type.

The number of electrodes in the embodiment described above is five, which is the number of electrodes necessary to execute offset cancellation processing by spinning current. When the offset voltage can be reduced to a level at which spinning current is unnecessary, at least three electrodes in total, with two electrodes serving as drive current supply electrodes and one electrode serving as a Hall voltage output electrode, are therefore sufficient.

What is claimed is:

1. A semiconductor device, comprising:
   a semiconductor substrate of a first conductivity type; and
   a vertical Hall element provided on the semiconductor substrate,
   the vertical Hall element including:
   a semiconductor layer of a second conductivity type formed on the semiconductor substrate;
   a plurality of electrodes aligned along a straight line on a surface of the semiconductor layer, and formed from impurity regions of the second conductivity type having a concentration higher than that of the semiconductor layer,
   a plurality of electrode isolation diffusion layers of the first conductivity type respectively arranged between adjacent electrodes of the plurality of electrodes on the surface of the semiconductor layer to isolate the plurality of electrodes from one another; and
   embedded layers formed from an impurity region of the second conductivity type having a concentration higher than that of the semiconductor layer, and respectively provided substantially right below one of the plurality of electrode isolation diffusion layers between the semiconductor substrate and the semiconductor layer.

2. The semiconductor device according to claim 1, wherein none of the embedded layers are provided right below the plurality of electrodes.

3. The semiconductor device according to claim 1, wherein the semiconductor layer includes an epitaxial layer.

4. The semiconductor device according to claim 2, wherein the semiconductor layer includes an epitaxial layer.

5. The semiconductor device according to claim 1, wherein the surface of the semiconductor layer and surfaces of the plurality of electrode isolation diffusion layers are covered with an insulating film, except for regions in which the plurality of electrodes are formed.

6. The semiconductor device according to claim 2, wherein the surface of the semiconductor layer and surfaces of the plurality of electrode isolation diffusion layers are covered with an insulating film, except for regions in which the plurality of electrodes are formed.

7. The semiconductor device according to claim 3, wherein the surface of the semiconductor layer and surfaces of the plurality of electrode isolation diffusion layers are covered with an insulating film, except for regions in which the plurality of electrodes are formed.

8. The semiconductor device according to claim 1, wherein a number of the plurality of electrodes is at least three.

9. The semiconductor device according to claim 2, wherein a number of the plurality of electrodes is at least three.

10. The semiconductor device according to claim 3, wherein a number of the plurality of electrodes is at least three.

11. The semiconductor device according to claim 4, wherein a number of the plurality of electrodes is at least three.

* * * * *

UNITED STATES PATENT AND TRADEMARK OFFICE
CERTIFICATE OF CORRECTION

PATENT NO. : 10,060,991 B2
APPLICATION NO. : 15/814986
DATED : August 28, 2018
INVENTOR(S) : Takaaki Hioka et al.

Page 1 of 1

It is certified that error appears in the above-identified patent and that said Letters Patent is hereby corrected as shown below:

In the Claims

Claim 1, Column 6, Line 50: delete "," and replace with (;)

Signed and Sealed this
Fourteenth Day of May, 2019

Andrei Iancu
*Director of the United States Patent and Trademark Office*